(12) United States Patent
Seydel et al.

(10) Patent No.: US 10,207,479 B2
(45) Date of Patent: Feb. 19, 2019

(54) MAGNETIC ARTICLES

(71) Applicant: VIAVI SOLUTIONS INC., Milpitas, CA (US)

(72) Inventors: Johannes Seydel, Petaluma, CA (US); Mark Tevis, Novato, CA (US); Kangning Liang, Santa Rosa, CA (US); Jeffrey James Kuna, San Francisco, CA (US); Jaroslaw Zieba, Santa Rosa, CA (US); Paul Thomas Kohlmann, Windsor, CA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 0 days.

(21) Appl. No.: 15/633,674

(22) Filed: Jun. 26, 2017

(65) Prior Publication Data
US 2017/0368798 A1 Dec. 28, 2017

Related U.S. Application Data

(60) Provisional application No. 62/355,188, filed on Jun. 27, 2016.

(51) Int. Cl.
*B32B 15/08* (2006.01)
*C08K 3/22* (2006.01)
(Continued)

(52) U.S. Cl.
CPC .............. *B32B 15/08* (2013.01); *B42D 25/29* (2014.10); *C08K 3/22* (2013.01); *C09C 1/0015* (2013.01);
(Continued)

(58) Field of Classification Search
None
See application file for complete search history.

(56) References Cited

U.S. PATENT DOCUMENTS

| 5,055,345 A | 10/1991 | Wank et al. |
| 5,569,535 A | 10/1996 | Phillips et al. |

(Continued)

FOREIGN PATENT DOCUMENTS

| EP | 1239307 | 9/2002 |
| EP | 1918334 | 5/2008 |

(Continued)

OTHER PUBLICATIONS

Arceneaux, et al., "Mitigation of Oxygen Inhibition in UV LED, UVA, and Low Intensity UV Cure", RadTech 2014, 11 pages.
(Continued)

*Primary Examiner* — Ali Naraghi
(74) *Attorney, Agent, or Firm* — Mannava & Kang, P.C.

(57) ABSTRACT

An article including a magnetic-containing layer having a first surface and a second surface opposite the first; a first reflector layer external to the first surface of the magnetic-containing layer; a second reflector layer external to the second surface of the magnetic-containing layer; a first selective light modulator layer external to the first reflector layer; a second selective light modulator layer external to the second reflector layer; a first absorber layer external to the first selective light modulator layer; and a second absorber layer external to the second selective light modulator layer; wherein at least one of the first and second selective light modulator layers comprises at least one of a curing agent, and at least one coating aid is disclosed. Methods of making the disclosed article are also disclosed.

20 Claims, 1 Drawing Sheet

(51) Int. Cl.
*H01L 23/14* (2006.01)
*C09D 11/037* (2014.01)
*C09C 1/00* (2006.01)
*B42D 25/29* (2014.01)

(52) U.S. Cl.
CPC .......... *C09D 11/037* (2013.01); *H01L 23/142* (2013.01); *B32B 2250/05* (2013.01); *C08K 2003/2265* (2013.01); *C09C 2200/1008* (2013.01); *C09C 2200/1054* (2013.01); *C09C 2200/24* (2013.01); *C09C 2200/301* (2013.01); *C09C 2200/304* (2013.01); *C09C 2200/507* (2013.01); *C09C 2220/106* (2013.01); *C09C 2220/20* (2013.01)

(56) References Cited

U.S. PATENT DOCUMENTS

| | | | |
|---|---|---|---|
| 5,743,981 A | 4/1998 | Lu | |
| 5,877,895 A | 3/1999 | Shaw et al. | |
| 6,132,504 A | 10/2000 | Kuntz et al. | |
| 6,139,613 A * | 10/2000 | Hendrickson | B32B 7/02 106/415 |
| 6,150,022 A | 11/2000 | Coulter et al. | |
| 6,156,115 A | 12/2000 | Pfaff et al. | |
| 6,235,105 B1 | 5/2001 | Hubbard et al. | |
| 6,236,510 B1 | 5/2001 | Bradley, Jr. et al. | |
| 6,531,221 B1 | 3/2003 | Schuhmacher | |
| 6,569,529 B1 * | 5/2003 | Phillips | C09C 1/0015 106/403 |
| 6,572,784 B1 * | 6/2003 | Coombs | B82Y 10/00 106/403 |
| 6,686,042 B1 | 2/2004 | LeGallee | |
| 6,841,238 B2 | 1/2005 | Argoitia et al. | |
| 6,979,704 B1 | 12/2005 | Mayer et al. | |
| 7,261,950 B2 | 8/2007 | Fleming et al. | |
| 7,455,904 B2 | 11/2008 | O'Keefe | |
| 7,629,051 B2 | 12/2009 | Fukushige et al. | |
| 7,767,123 B2 | 8/2010 | Argoitia | |
| 7,951,418 B2 | 5/2011 | O'Keefe | |
| 8,815,337 B2 | 8/2014 | Yializis et al. | |
| 9,212,089 B2 | 12/2015 | Arsten et al. | |
| 2002/0015914 A1 * | 2/2002 | Miyamoto | G11B 7/00718 430/270.13 |
| 2002/0160194 A1 | 10/2002 | Phillips et al. | |
| 2002/0182383 A1 * | 12/2002 | Phillips | B05D 3/20 428/199 |
| 2003/0215641 A1 | 11/2003 | Phillips et al. | |
| 2004/0166308 A1 | 8/2004 | Raksha et al. | |
| 2006/0023327 A1 | 2/2006 | Coombs et al. | |
| 2006/0068115 A1 | 3/2006 | Ogawa | |
| 2006/0263539 A1 | 11/2006 | Argoitia | |
| 2007/0062445 A1 | 3/2007 | Kodou et al. | |
| 2009/0081460 A1 * | 3/2009 | Argoitia | C09C 1/0015 428/404 |
| 2009/0322993 A1 | 12/2009 | Saito et al. | |
| 2010/0261017 A1 | 10/2010 | Kikuchi | |
| 2012/0177844 A1 | 7/2012 | Biver et al. | |
| 2013/0164529 A1 | 6/2013 | Yu et al. | |
| 2014/0050768 A1 | 2/2014 | Struck et al. | |
| 2014/0238833 A1 | 8/2014 | Virkar et al. | |
| 2016/0326374 A1 | 11/2016 | Kuna et al. | |
| 2016/0333526 A1 * | 11/2016 | Macpherson | D21H 21/48 |

FOREIGN PATENT DOCUMENTS

| | | |
|---|---|---|
| JP | S55160060 | 12/1980 |
| JP | S60184001 U | 12/1985 |
| JP | 1-36891 Y2 | 11/1989 |
| JP | 2000511587 | 9/2000 |
| JP | 2000511968 | 9/2000 |
| JP | 2002530712 A | 9/2002 |
| JP | 2003329824 A | 11/2003 |
| JP | 2003335880 | 11/2003 |
| JP | 2004510013 A | 4/2004 |
| JP | 2006347167 A | 12/2006 |
| JP | 2007232958 A | 9/2007 |
| JP | 2010247369 | 11/2010 |
| JP | 2012097135 | 5/2012 |
| JP | 2013505354 | 2/2013 |
| JP | 2013242396 | 12/2013 |
| WO | 00/31571 | 6/2000 |
| WO | 2004/072186 | 8/2004 |
| WO | 2016076333 | 5/2016 |

OTHER PUBLICATIONS

Husar, et al., "The formulator's guide to anti-oxygen inhibition additives", Progress in Organic Coatings 77, 2014, p. 1789-1798, 10 pages.

* cited by examiner

MAGNETIC ARTICLES

RELATED APPLICATION

The present application claims the benefit of priority to U.S. Provisional Application No. 62/355,188, filed on Jun. 27, 2016, the entire disclosure of which is hereby incorporated by reference.

FIELD OF THE INVENTION

The present disclosure generally relates to articles that can (i) include a strong color, (ii) be goniochromatic, and (iii) have a high flop, i.e., a specular and metallic appearance that varies in lightness, hue, or chromaticity as the viewing angle varies angle varies. Methods of making the articles are also disclosed.

BACKGROUND OF THE INVENTION

Articles, such as flakes, can be used as a security feature of currency and consumer applications with enhanced optical properties. Unfortunately, present manufacturing methods, such as vapor deposition processes, require expensive and complex equipment to make the flakes. Cheaper methods that presently exist provide poor quality pigments for use as security features. Additionally, the deposition of polymer thin films by evaporation results in poor interlayer adhesion. Moreover, working in a vacuum negatively impacts the productivity of this equipment over time. Further, there is extensive non-productive time related to maintenance of this equipment, which requires pumping and venting the chambers. Furthermore, the type of materials available for use in making articles, such as optical devices in the form of flakes, foils, and sheets is limited to only those that can be vaporized under low pressure, thereby eliminating most organic materials.

SUMMARY OF THE INVENTION

In an aspect, there is disclosed an article comprising a magnetic containing layer having a first surface and a second surface opposite the first surface; a first reflector layer external to the first surface of the magnetic containing layer; a second reflector layer external to the second surface of the magnetic containing layer; a first selective light modulator layer external to the first reflector layer; a second selective light modulator layer external to the second reflector layer; a first absorber layer external to the first selective light modulator layer; and a second absorber layer external to the second selective light modulator layer; wherein at least one of the first and second selective light modulator layers comprises at least one of a curing agent, and at least one coating aid.

In another aspect, there is disclosed an article including a magnetic containing layer having a first surface and a second surface opposite the first surface; a first reflector layer external to the first surface of the magnetic containing layer; a second reflector layer external to the second surface of the magnetic containing layer; a first selective light modulator layer external to the first reflector layer; a second selective light modulator layer external to the second reflector layer; a first absorber layer external to the first selective light modulator layer; and a second absorber layer external to the second selective light modulator layer; wherein at least one of the first and second selective light modulator layers comprises at least one of a curing agent, and at least one oxygen inhibition mitigation composition.

In a further aspect, there is disclosed a method for forming an article comprising depositing on a substrate a first absorber layer; depositing on the first absorber layer a first selective light modulator layer; depositing on the first selective light modulator layer a first reflector layer; depositing on the first reflector layer a magnetic containing layer; depositing on the magnetic containing layer a second reflector layer; depositing on the second reflector layer a second selective light modulator layer; and depositing on the second selective light modulator layer a second absorber layer; wherein at least one of the first and second selective light modulator layers is depositing using a liquid coating process.

Additional features and advantages of various embodiments will be set forth, in part, in the description that follows, and will, in part, be apparent from the description, or may be learned by the practice of various embodiments. The objectives and other advantages of various embodiments will be realized and attained by means of the elements and combinations particularly pointed out in the description herein.

BRIEF DESCRIPTION OF THE DRAWINGS

The present disclosure in its several aspects and embodiments can be more fully understood from the detailed description and the accompanying drawings, wherein.

Throughout this specification and figures like reference numbers identify like elements.

DETAILED DESCRIPTION OF THE INVENTION

Figure 1:
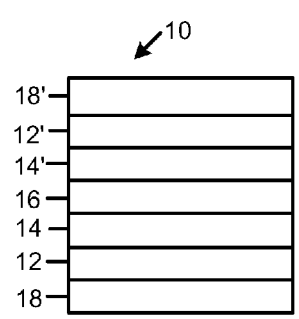
FIG. 1 is a cross-sectional view of an article, according to an example of the present disclosure.

It is to be understood that both the foregoing general description and the following detailed description are exemplary and explanatory only, and are intended to provide an explanation of various embodiments of the present teachings.

In its broad and varied embodiments, disclosed herein are articles, such as optical devices in the form of flakes, sheet, or foils, and a method of manufacturing the articles.

In an aspect, the article 10 can include a magnetic-containing layer 16 having a first surface and a second surface opposite the first surface; a first reflector layer 14 external to the first surface of the magnetic-containing layer 16; a second reflector layer 14' external to the second surface of the magnetic-containing layer 16; a first selective light modulator layer 12 external to the first reflector layer 14; a second selective light modulator layer 12' external to the second reflector layer 14'; a first absorber layer 18 external to the first selective light modulator layer 12; and a second absorber layer 18' external to the second selective light modulator layer 12'; wherein at least one of the first and second selective light modulator layers 12, 12' comprises at least one of a curing agent, and at least one coating aid. In another aspect, the article 10 can include wherein at least one of the first and second selective light modulator layers 12, 12' comprises at least one of a curing agent, and at least one oxygen inhibition mitigation composition.

Figure 2:
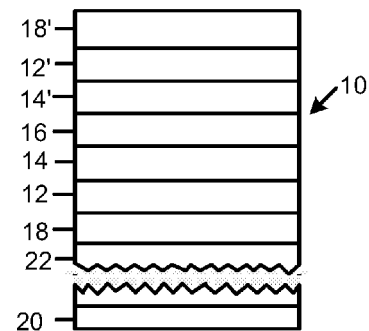
FIG. 2 is a cross-sectional view of an article prior to being released from a substrate having a release layer, according to an example of the present disclosure.

FIGS. 1-2 illustrate various articles 10, such as optical devices in the form of flakes, foils, or sheets, according to various examples of the present disclosure. Although, these Figures illustrate specific layers in specific orders, one of ordinary skill in the art would appreciate that the article 10 can include any number of layers in any order. Additionally, the composition of any particular layer can be the same or different from the composition of any other layer. It is also envisioned that the articles 10 disclosed herein can include additional layers, such as intermediate layers or intervening layers. It is also envisioned that the layers of the articles 10 may be surfaced modified, such as by oxidation.

In some examples, the article 10 can exhibit optical interference. Alternatively, in some examples, the article 10 can not exhibit optical interference. In an aspect, the article 10 can exploit interference to generate color. In another aspect, the article 10 can not exploit interference to generate color. For example, as described in further detail below, the appearance of color can be generated by including a selective light modulator system (SLMS), such as an additive, a selective light modulator particle (SLMP) or a selective light modulator molecule (SLMM) in the selective light modulator layer (SLML).

In an aspect, as shown in FIGS. 1 and 2, the article 10 can be in a form of a foil, flake, or sheet that can be used on an object or a substrate 20. In an aspect, an optical device can include portions of a sheet. In another aspect, an article 10 can include an optical device and a liquid medium. In another aspect, the article 10 is an optical device in the form of a flake, for example having 100 nm to 100 μm in thickness and 100 nm to 1 mm in size. The article 10 can be a color shifting colorant (in combination with a liquid medium), or can be used as a security feature for currency. Some attributes common to use of the article 10 can include high chromaticity (or strong color), color change with respect to viewing angle (also known as goniochromaticity or iridescence), and flop (a specular appearance that varies in lightness, hue, or chromaticity as the viewing angle varies).

The article 10, such as an optical device in the form of a sheet, flake, or foil, can include at least one dielectric layer, such as a first selective light modulator layer (SLML) 12, a second SLML 12', a third SLML 12", a fourth SLML 12''', and etc. If more than one SLML 12, 12' is present in an optical device, each SLML can be independent in terms of their respective compositions and physical properties. For example, a first SLML 12 can have a composition with a first refractive index, but a second SLML 12' in the same optical device can have a different composition with a different refractive index. As another example, a first SLML 12 can have a composition at a first thickness, but the second SLML 12' can have the same composition at a second thickness different from the first thickness. Additionally or alternatively, the article 10 in the form of a flake, sheet, or foil can also include a hard coat or protective layer on the surfaces of SLML 14 14', 14", or 14'''. In some examples, these layers (hard coat or protective layer) do not require optical qualities.

As shown in FIGS. 1 and 2, at least two surfaces/sides of magnetic-containing layer 16 and/or first and second reflector layers 14, 14', for example, the right and left surface/side as shown, can be free of SLMLs 12, 12'. In an aspect, if the article 10 is in the form of a flake or foil, then magnetic-containing layer 16 and/or first and second reflector layers 14, 14' can include more than the four surfaces exemplified in FIGS. 1 and 2. In those instances, for example, one, two, three, four, or five surfaces of magnetic-containing layer 16 and/or first and second reflector layers 14, 14' can be free of SLMLs 12. In some examples, one, two, three, four, or five surfaces of magnetic-containing layer 16 and/or first and second reflector layers 14, 14', and therefore article 10, can be open to the air. In an example, open sides, i.e., surfaces of the reflector that do not contain an external SLML, can be an advantage for flop.

The magnetic-containing layer 16 can include magnetic permeable, magnetic orientable materials, magnetic materials, and combinations thereof. A magnetic material, such as ferromagnetic and ferrimagnetic materials, includes but is not limited to, nickel, cobalt, iron, gadolinium, terbium, dysprosium, erbium, and their alloys or oxides. For example, a cobalt nickel alloy can be employed, with the cobalt and nickel having a ratio by weight of about 80% and about 20%, respectively. This ratio for each of these metals in the cobalt nickel alloy can be varied by plus or minus about 10%. Other examples of alloys include, but are not limited to, Fe/Si, Fe/Ni, Fe/Co, Fe/Ni/Mo, Fe/Cr, Ni/Cr, and combinations thereof. In an aspect, the magnetic-containing layer 16 can include a polymer containing iron oxide particles. Hard magnets of the type $SmCo_5$, $NdCo_5$, $Sm_2Co_{17}$, $Nd_2Fe_{14}B$, $Sr_6Fe_2O_3$, $TbFe_2$, Al—Ni—Co, and combinations thereof, can also be used as well as spinel ferrites of the type $Fe_3O_4$, $NiFe_2O_4$, $MnFe_2O_4$, $CoFe_2O_4$, or garnets of the type YIG or GdIG, and combinations thereof. In an aspect, the magnetic material may be ferritic stainless steel. The magnetic material can be selected for its reflecting or absorbing properties as well as its magnetic properties. The magnetic-containing layer 16 may be formed by a material having magnetic and non-magnetic particles, or magnetic particle within non-magnetic medium, for example cobalt-doped zinc oxide film deposited on substrate 20.

Although this broad range of magnetic materials can be used, "soft" magnets can be used in an aspect. As used herein, the term "soft magnets" refers to any material exhibiting ferromagnetic properties but having a remanence that is substantially zero after exposure to a magnetic force. Soft magnets can show a quick response to an applied magnetic field, but have very low (coercive fields (Hc) =0.05-300 Oersted (Oe)) or zero magnetic signatures, or retain very low magnetic lines of force after the magnetic field is removed. Similarly, as used herein, the term "hard magnets" (also called permanent magnets) refers to any material that exhibits ferromagnetic properties and that has a long lasting remanence after exposure to a magnetizing force. A ferromagnetic material is any material that has permeability substantially greater than 1 and that exhibits magnetic hysteresis properties. In an aspect, any magnetic material can be used in the magnetic-containing layer 16 so long as the material enables the orienting of the article 10 in a magnetic field.

The magnetic-containing layer 16 can have a thickness ranging from about 10 nm to about 100 nm, for example from about 35 nm to about 45 nm, and as a further example from about 40 nm. The magnetic-containing layer 16 can be deposited to a thickness so that it is substantially opaque. In an aspect, the magnetic-containing layer 16 can be deposited to a thickness so that it is not substantially opaque.

The magnetic-containing layer 16 can be formed using conventional deposition processes, such as physical vapor deposition techniques; as well as sputtering including magnetron sputtering; thermal evaporation; electron beam evaporation; and cathodic arc evaporation. In an aspect, the magnetic-containing layer 16 can also be formed using a liquid coating process as described herein in a manner similar to forming a first or second selective light modulator layer 12, 12'.

The first reflector layer 14 and the second reflector layer 14' can each independently be a wideband reflector, e.g., spectral and Lambertian reflector (e.g., white $TiO_2$). The first 14, and/or second 14', reflector layers can each independently include metals, non-metals, and/or metal alloys. The terms "metallic" or "metallic layer" used herein, unless otherwise stated, are intended to include all metals, metal alloys, pure metal or metal alloy containing materials, compound, compositions, and/or layers.

In one example, the materials for the first and second reflector layers 14, 14' can each independently include any materials that have reflective characteristics in the desired spectral range. For example, any material with a reflectance ranging from 5% to 100% in the desired spectral range. An example of a reflective material can be aluminum, which has good reflectance characteristics, is inexpensive, and easy to form into or deposit as a thin layer. Other materials can also be used in place of aluminum. For example, copper, silver, gold, platinum, palladium, nickel, cobalt, niobium, chromium, tin, and combinations or alloys of these or other metals can be used as reflective materials. In an aspect, the material for the first and/or second reflector layers 14, 14' can be a white or light colored metal. In other examples, the first 14 and/or second 14' reflector layers can include, but is not limited to, the transition and lanthanide metals and combinations thereof; as well as metal carbides, metal oxides, metal nitrides, metal sulfides, a combination thereof, or mixtures of metals and one or more of these materials.

The thickness of the first and/or second reflector layers 14, 14' can range from about 5 nm to about 5000 nm, although this range should not be taken as restrictive. For example, the lower thickness can be selected so that the first 14 and/or second 14' reflector layers provide a maximum transmittance of 0.8. Additionally, or alternatively, for a first 14 and/or second 14' reflector layer including aluminum the minimum optical density (OD) can be from about 0.1 to about 4 at a wavelength of about 550 nm.

In order to obtain a sufficient optical density and/or achieve a desired effect, a higher or lower minimum thicknesses can be required depending upon the composition of the first 14 and/or second 14' reflector layer. In some examples, the upper limit can be about 5000 nm, about 4000 nm, about 3000 nm, about 1500 nm, about 200 nm, and/or about 100 nm. In one aspect, the thickness of the first 14 and/or second 14' reflector layer can range from about 10 nm to about 5000 nm for example, from about 15 nm to about 4000 nm, from about 20 nm to about 3000 nm, from about 25 nm to about 2000 nm, from about 30 nm to about 1000 nm, from about 40 nm to about 750 nm, or from about 50 nm to about 500 nm, such as from about 60 nm to about 250 nm or from about 70 nm to about 200 nm.

The article 10, for example, in the form of a sheet, foil, or flake, of FIGS. 1 and 2 can include a first selective light modulator layer (SLML) 12 and a second selective light modulator layer 12'. The SLML is a physical layer comprising a plurality of optical functions aiming at modulating (absorbing and or emitting) light intensity in different, selected regions of spectrum of electromagnetic radiation with wavelengths ranging from about 0.2 μm to about 20 μm.

SLMLs 12, 12' (and/or the materials within the SLMLs 12, 12') can selectively modulate light. For example, an SLML can control the amount of transmission in specific wavelengths. In some examples, the SLML can selectively absorb specific wavelengths of energy (e.g., in the visible and/or non-visible ranges). For example, the SLML 12, 12' can be a "colored layer" and/or a "wavelength selective absorbing layer." In some examples, the specific wavelengths absorbed can cause the article 10, for example, in the form of a flake, to appear a specific color. For example, the SLML 12, 12' can appear red to the human eye (e.g., the SLML can absorb wavelengths of light below approximately 620 nm and thus reflect or transmit wavelengths of energy that appear red). This can be accomplished by adding SLMPs that are colorants (e.g., organic and/or inorganic pigments and/or dyes) to a host material, such as a dielectric material, including but not limited to a polymer. For example, in some instances, the SLML can be a colored plastic.

In some examples, some or all of the specific wavelengths absorbed can be in the visible range (e.g., the SLML can be absorbing throughout the visible, but transparent in the infrared). The resulting article 10, for example in the form of a flake, would appear black, but reflect light in the infrared. In some examples described above, the wavelengths absorbed (and/or the specific visible color) of the article 10 and/or SLML 12, 12' can depend, at least in part, on the thickness of the SLML 12, 12'. Additionally or alternatively, the wavelengths of energy absorbed by the SLML 12, 12' (and/or the color in which these layers and/or the flake appears) can depend in part on the addition of certain aspects to the SLML. In addition to absorbing certain wavelengths of energy, the SLML 12, 12' can achieve at least one of bolstering the magnetic-containing layer 16 and/or first and second reflector layers 14, 14' against degradation; enabling release from a substrate; enabling sizing; providing some resistance to environmental degradation, such as oxidation of aluminum or other metals and materials used in the first and second reflector layers 14, 14'; and high performance in transmission, reflection, and absorption of light based upon the composition and thickness of the SLML 12, 12'.

In some examples, in addition to or as an alternative to the SLMLs 12, 12' selectively absorbing specific wavelengths of energy and/or wavelengths of visible light, the SLMLs 12, 12' of the article 10, for example in the form of a sheet, foil, or flake, can control the refractive index and/or the SLMLs 12, 12' can include SLMPs that can control refractive index. SLMPs that can control the refractive index of the SLML 12, 12' can be included with the host material in addition to or as an alternative to an absorption controlling SLMPs (e.g., colorants). In some examples, the host material can be combined with both absorption controlling SLMPs and refractive index SLMPs in the SLMLs 12, 12'. In some examples, the same SLMP can control both absorption and refractive index.

The first and second SLMLs 12, 12' can each independently be external to the first and second reflector layers 14, 14'. The first and second SLML 12, 12' can each independently have a refractive index of greater or less than about 1.5. For example, each SLML 12, 12' can have a refractive index of approximately 1.5. The refractive index of each SLML 12, 12' can be selected to provide a degree of color travel required wherein color travel can be defined as the change in hue angle measured in L*a*b* color space with the viewing angle. In some examples, each SLMLs 12, 12' can include a refractive index in a range of from about 1.1 to about 3.0, about 1.0 to about 1.3, or about 1.1 to about 1.2. In some examples, the refractive index of each SLMLs 12, and 12' can be less than about 1.5, less than about 1.3, or less than about 1.2. In some examples, SLML 12 and SLML 12' can have substantially equal refractive indexes or different refractive indexes one from the other.

The first and second SLML 12, 12' can each independently have a thickness ranging from about 1 nm to about 10000 nm, about 10 nm to about 1000 nm, about 20 nm to about 500 nm, about 1 nm, to about 100 nm, about 10 nm to about 1000 nm, about 1 nm to about 5000 nm. In an aspect, the article 10, such as an optical device, can have an aspect ratio of 1:1 to 1:50 thickness to width.

One of the benefits of the articles 10 described herein, however, is that, in some examples, the optical effects appear relatively insensitive to thickness variations. Thus, in some aspects, each SLML 12, 12' can independently have a variation in optical thickness of less than about 5%. In an aspect, each SLML 12, 12' can independently include an optical thickness variation of less than about 3% across the layer. In an aspect, each SLML 12, 12' can independently have less than about 1% variation in optical thickness across the layer having a thickness of about 50 nm.

In each aspect, the first and second SLMLs 12, 12' can independently be a transparent colorless layer, can be a transparent colored layer, or can be a colored layer.

The performance of the first and second SLMLs 12, 12' can be determined based upon the selection of materials present in each of the SLML 12, 12'. It is believed that each of the SLML 12, 12' can achieve high performance in transmission, reflection, and absorption of light based upon the composition of each of the SLML 12, 12'. In an aspect, each of the SLML 12, 12' can comprise a composition that allows for a wider range of materials configured to increase the control of the optical performance of each of the SLML 12, 12'. In an aspect, each of the SLML 12, 12' can improve at least one of the following properties: flake handling, corrosion, alignment, and environmental performance of any other layers within article 10, e.g., the first and second reflector layers 14, 14'.

The first and second SLML 12, 12' can each independently comprise a host material alone, or a host material combined with a selective light modulator system (SLMS). In an aspect, at least one of the first SLML 12 and the second SLML 12' includes a host material. In another aspect, at least one of the first SLML 12 and the second SLML 12' includes a host material and a SLMS. The SLMS can include a selective light modulator molecule (SLMM), a selective light modulator particle (SLMP), an additive, or combinations thereof.

The composition of the SLML 12, 12' can have a solids content ranging from about 0.01% to about 100%, for example from about 0.05% to about 80%, and as a further example from about 1% to about 30%. In some aspects, the solids content can be greater than 3%. In some aspects, the composition of the SLMLs 12, 12' can have a solids content ranging from about 3% to about 100%, for example from about 4% to 50%.

The host material of each of the first and/or second SLMLs 12, 12' can independently be a film forming material applied as a coating liquid and serving optical and structural purposes. The host material can be used as a host (matrix) for introducing, if necessary, a guest system, such as the selective light modulator system (SLMS), for providing additional light modulator properties to the article 10.

The host material can be a dielectric material. Additionally or alternatively, the host material can be at least one of an organic polymer, an inorganic polymer, and a composite material. Non-limiting examples of the organic polymer include thermoplastics, such as polyesters, polyolefins, polycarbonates, polyamides, polyimides, polyurethanes, acrylics, acrylates, polyvinylesters, polyethers, polythiols, silicones, fluorocarbons, and various co-polymers thereof; thermosets, such as epoxies, polyurethanes, acrylates, melamine formaldehyde, urea formaldehyde, and phenol formaldehyde; and energy curable materials, such as acrylates, epoxies, vinyls, vinyl esters, styrenes, and silanes. Non-limiting examples of inorganic polymers includes silanes, siloxanes, titanates, zirconates, aluminates, silicates, phosphazanes, polyborazylenes, and polythiazyls.

Each of the first and second SLMLs 12, 12' can include from about 0.001% to about 100% by weight of a host material. In an aspect, the host material can be present in the SLML in an amount ranging from about 0.01% to about 95% by weight, for example from about 0.1% to about 90%, and as a further example from about 1% to about 87% by weight of the SLML.

The SLMS, for use in the SLMLs 12, 12' with the host material, can each independently comprise selective light modulator particles (SLMP), selective light modulator molecules (SLMM), additives, or a combination thereof. The SLMS can also comprise other materials. The SLMS can provide modulation of the amplitude of electromagnetic radiation (by absorption, reflectance, fluorescence etc.) in a selective region or the entire spectral range of interest (0.2 µm to 20 µm).

The first and second SLMLs 12, 12' can each independently include in an SLMS a SLMP. The SLMP can be any particle combined with the host material to selectively control light modulation, including, but not limited to color shifting particles, dyes, colorants includes colorant includes one or more of dyes, pigments, reflective pigments, color shifting pigments, quantum dots, and selective reflectors. Non-limiting examples of a SLMP include: organic pigments, inorganic pigments, quantum dots, nanoparticles (selectively reflecting and/or absorbing), micelles, etc. The nanoparticles can include, but are not limited to organic and metalorganic materials having a high value of refractive index (n>1.6 at wavelength of about 550 nm); metal oxides, such as $TiO_2$, $ZrO_2$, $In_2O_3$, $In_2O_3$—SnO, $SnO_2$, $Fe_xO_y$ (wherein x and y are each independently integers greater than 0), and $WO_3$; metal sulfides, such as ZnS, and $Cu_xS_y$ (wherein x and y are each independently integers greater than 0); chalcogenides, quantum dots, metal nanoparticles; carbonates; fluorides; and mixtures thereof.

Examples of a SLMM include but are not limited to: organic dyes, inorganic dyes, micelles, and other molecular systems containing a chromophore.

In some aspects, SLMS of each of the first and second SLMLs 12, 12' can include at least one additive, such as a curing agent, and a coating aid. In some other aspect, SLMS of each of the first and second SLMLs 12, 12' can include at least one additive, such as a curing agent, and at least one of an oxygen inhibition mitigation composition.

The curing agent can be a compound or material that can initiate hardening, vitrification, crosslinking, or polymerizing of the host material. Non-limiting examples of a curing agent include at least one of solvents, radical generators (by energy or chemical), acid generators (by energy or chemical), condensation initiators, and acid/base catalysts.

Non-limiting examples of the coating aid include leveling agents, wetting agents, defoamers, adhesion promoters, antioxidants, UV stabilizers, curing inhibition mitigating agents, antifouling agents, corrosion inhibitors, photosensitizers, secondary crosslinkers, and infrared absorbers for enhanced infrared drying. In an aspect, the antioxidant can be present in the composition of the SLML 12, 12' in an amount ranging from about 25 ppm to about 5% by weight.

The first and second SLMLs 12, 12' can each independently comprise a solvent. Non-limiting examples of solvents can include acetates, such as ethyl acetate, propyl acetate, and butyl acetate; acetone; water; ketones, such as dimethyl ketone (DMK), methylethyl ketone (MEK), secbutyl methyl ketone (SBMK), ter-butyl methyl ketone (TBMK), cyclopenthanon, and anisole; glycol and glycol derivatives, such as propylene glycol methyl ether, and propylene glycol methyl ether acetate; alcohols, such as isopropyl alcohol, and diacetone alcohol; esters, such as malonates; heterocyclic solvents, such as n-methyl pyrrolidone; hydrocarbons, such as toluene, and xylene; coalescing solvents, such as glycol ethers; and mixtures thereof. In an aspect, the solvent can be present in each of the first and second SLML 12, 12' in an amount ranging from about 0% to about 99.9%, for example from about 0.005% to about 99%, and as a further example from about 0.05% to about 90% by weight relative to the total weight of the SLML 12, 12'.

In some examples, the first and second SLML 12, 12' can each independently include a composition having at least one of (i) a photoinitiator, (ii) an oxygen inhibition mitigation composition, (iii) a leveling agent, and (iv) a defoamer. In an aspect, the first and second SLML 12, 12' can include a curing agent and an oxygen inhibition mitigation composition.

The oxygen inhibition mitigation composition can be used to mitigate the oxygen inhibition of the free radical material. The molecular oxygen can quench the triplet state of a photoinitiator/sensitizer or it can scavenge the free radicals resulting in reduced coating properties and/or uncured liquid surfaces. The oxygen inhibition mitigation composition can reduce the oxygen inhibition or can improve the cure of any SLMLs 12, 12'.

The oxygen inhibition composition can comprise more than one compound. The oxygen inhibition mitigation composition can comprise at least one acrylate, for example at least one monomer and at least one acrylate oligomer. In an aspect, the oxygen inhibition mitigation composition can comprise at least one acrylate monomer and two acrylate oligomers. Non-limiting examples of an acrylate for use in the oxygen inhibition mitigation composition can include acrylates; methacrylates; epoxy acrylates, such as modified epoxy acrylate; polyester acrylates, such as acid functional polyester acrylates, tetra functional polyester acrylates, modified polyester acrylates, and bio-sourced polyester acrylates; polyether acrylates, such as amine modified polyether acrylates including amine functional acrylate co-initiators and tertiary amine co-initiators; urethane acrylates, such aromatic urethane acrylates, modified aliphatic urethane acrylates, aliphatic urethane acrylates, and aliphatic allophanate based urethane acrylates; and monomers and oligomers thereof. In an aspect, the oxygen inhibition mitigation composition can include at least one acrylate oligomer, such as two oligomers. The at least one acrylate oligomer can be chosen from a polyester acrylate and a polyether acrylate, such as a mercapto modified polyester acrylate and an amine modified polyether tetraacrylate. The oxygen inhibition mitigation composition can also include at least one monomer, such as 1,6-hexanediol diacrylate. The oxygen inhibition mitigation composition can be present in the first and/or second SLML 12, 12' in an amount ranging from about 5% to about 95%, for example from about 10% to about 90%, and as a further example from about 15% to about 85% by weight relative to the total weight of the composition of the SLML 12, 12'.

In some examples, the host material of the SLML 12, 12' can use a non-radical cure system such as a cationic system. Cationic systems are less susceptible to the mitigation of the oxygen inhibition of the free radical process, and thus may not require an oxygen inhibition mitigation composition. In an example, the use of the monomer Ethyl-3-hydroxymethyloxetane does not require an oxygen mitigation composition.

In an aspect, the first and second SLML 12, 12' can each independently include at least one photoinitiator, such as two photoinitiators, or three photoinitiators. The photoinitiator can be used for shorter wavelengths. The photoinitiator can be active for actinic wavelength. The photoinitiator can be a Type 1 photoinitiator or a Type II photoinitiator. The SLML 12, 12' can include only Type I photoinitiators, only Type II photoinitiators, or a combination of both Type I and Type II photoinitiators. The photoinitiator can be present in the composition of the SLML 12, 12' in an amount ranging from about 0.25% to about 15%, for example from about 0.5% to about 10%, and as a further example from about 1% to about 5% by weight relative to the total weight of the composition of the SLML 12, 12'.

The photoinitiator can be a phosphineoxide. The phosphineoxide can include, but is not limited to, a monoacyl phosphineoxide and a bis acyl phosphine oxide. The mono acyl phosphine oxide can be a diphenyl (2,4,6-trimethylbenzoyl)phosphineoxide. The bis acyl phosphine oxide can be a bis (2,4,6-trimethylbenzoyl)phenylphosphineoxide. In an aspect, at least one phosphineoxide can be present in the composition of the SLML 12, 12'. For example, two phosphineoxides can be present in the composition of the SLML 12, 12'.

A sensitizer can be present in the composition of the SLML 12, 12' can act as a sensitizer for Type 1 and/or a Type II photoinitiators. The sensitizer can also act as a Type II photoinitiator. In an aspect, the sensitizer can be present in the composition of the SLML 12, 12' in an amount ranging from about 0.05% to about 10%, for example from about 0.1% to about 7%, and as a further example from about 1% to about 5% by weight relative to the total weight of the composition of the SLML 12, 12'. The sensitizer can be a thioxanthone, such as 1-chloro-4-propoxythioxanthone.

In an aspect, the SLML 12, 12' can include a leveling agent. The leveling agent can be a polyacrylate. The leveling agent can eliminate cratering of the composition of the SLML 12, 12'. The leveling agent can be present in the composition of the SLML 12, 12' in an amount ranging from about 0.05% to about 10%, for example from about 1% to about 7%, and as a further example from about 2% to about 5% by weight relative to the total weight of the composition of the SLML 12, 12'.

The SLML 12, 12' can also include a defoamer. The defoamer can reduce surface tension. The defoamer can be a silicone free liquid organic polymer. The defoamer can be present in the composition of the SLML 12, 12' in an amount ranging from about 0.05% to about 5%, for example from about 0.2% to about 4%, and as a further example from about 0.4% to about 3% by weight relative to the total weight of the composition of the SLML 12, 12'.

Referring to FIGS. 1-2, each of the first and second absorber layers 18, 18' can be external to its corresponding SLML 12, 12'. No matter what the configuration may be, the first and second absorber layer 18, 18' can each independently include metals, non-metals, or metal alloys. In one example, the materials for the first and second absorber layers 18, 18' can include any absorber material, including both selective absorbing materials and nonselective absorbing materials. For example, the first and second absorber layers 18, 18' can be formed of nonselective absorbing metallic materials deposited to a thickness at which the layer is at least partially absorbing, or semi-opaque. An example of a non-selective absorbing material can be a gray metal, such as chrome or nickel. An example of a selective absorbing material can be copper or gold. In an aspect, the absorbing material can be chromium. Non-limiting examples of suitable absorber materials include metallic absorbers such as chromium, aluminum, silver, nickel, palladium, platinum, titanium, vanadium, cobalt, iron, tin, tungsten, molybdenum, rhodium, niobium, copper, as well as other absorbers such as carbon, graphite, silicon, germanium, cermet, ferric oxide or other metal oxides, metals mixed in a dielectric matrix, and other substances that are capable of acting as a uniform or selective absorber in the visible spectrum. Various combinations, mixtures, compounds, or alloys of the above absorber materials that may be used to form the first and second absorber layers 18, 18'.

Examples of suitable alloys of the above absorber materials can include Inconel (Ni—Cr—Fe), stainless steels, Hastalloys (Ni—Mo—Fe; Ni—Mo—Fe—Cr; Ni—Si—Cu) and titanium-based alloys, such as titanium mixed with carbon (Ti/C), titanium mixed with tungsten (Ti/W), titanium mixed with niobium (Ti/Nb), and titanium mixed with silicon (Ti/Si), and combinations thereof. Other examples of suitable compounds for the first and second absorber layers 18, 18' include, but are not limited to, titanium-based compounds such as titanium silicide (TiSi2), titanium boride (TiB2), and combinations thereof. Alternatively, the first and second absorber layers 18, 18' can be composed of a titanium-based alloy deposited in a matrix of Ti, or can be composed of Ti deposited in a matrix of a titanium-based alloy. For example, as shown in FIGS. 1-2, the first and second absorber layers 18, 18' can include chromium.

The first and second absorber layers 18, 18' can also be formed of a magnetic material, such as a cobalt nickel alloy. This can simplify the manufacture of a magnetic color shifting device or structure by reducing the number of materials required.

The first and second absorber layers 18, 18' can be formed to have a physical thickness in the range from about 1 nm to about 50 nm, such as from about 5 nm to about 10 nm, depending upon the optical constants of the absorber layer material and the desired peak shift. The first and second absorber layers 18, 18' can each be composed of the same material or a different material, and can have the same or different physical thickness for each layer.

As shown in FIG. 1, article 10 includes layers 12, 12', 14, 14', 16, 18, and 18'. However, it should be noted that article 10 may include more or fewer layers in any order or configuration as desired for a particular implementation.

In an aspect, the article 10, such as an optical device in the form of a flake, foil or sheet, can also include a substrate 20 and a release layer 22 as shown in FIG. 2. In an aspect, the release layer 22 can be disposed between the substrate 20 and the first absorber layer 18.

The article 10, such as optical devices, described herein can be made in any way. For example, a flake (e.g., article 10 of FIGS. 1 and 2) can be made and then divided, broken, ground, etc. into smaller pieces forming an optical device. In some examples, the flake (e.g., article 10 of FIGS. 1 and 2) can be created by a liquid coating process, including, but not limited the processes described below and/or with respect to FIG. 3.

There is also a disclosed a method for manufacturing an article 10, such as an optical device in the form of a flake, as described herein. The method can comprise depositing on a substrate 20 a first absorber layer 18; depositing on first absorber layer 18 a first selective light modulator layer 12; depositing on the first selective light modulator layer 12 a first reflector layer 14; depositing on the first reflector layer 14 a magnetic-containing layer 16; depositing on the magnetic-containing layer 16 a second reflector layer 14'; depositing on the second reflector layer 14' a second selective light modulator layer 12'; and depositing on the second selective light modulator layer 12' a second absorber layer 18'; wherein at least one of the first and second selective light modulator layers 12, 12' is deposited using a liquid coating process.

With respect to the aspect shown in FIGS. 1 and 2, in general, the method for fabricating the article 10 can involve a first absorber layer 18 external to and deposited on a substrate 20 having a release layer 22, as shown in FIG. 2.

The substrate 20 can be made of a flexible material. The substrate 20 can be any suitable material that can receive the deposited layers. Non-limiting examples of suitable substrate materials include polymer web, such as polyethylene terephthalate (PET), glass, silicon wafers, etc. The substrate 20 can vary in thickness, but can range for example from about 2 μm to about 100 μm, and as a further example from about 10 to about 50 μm.

The first absorber layer 18 can be deposited onto the substrate 20 by conventional deposition processes, such as physical vapor deposition, chemical vapor deposition, thin-film deposition, atomic layer deposition, etc., including modified techniques such as plasma enhanced and fluidized bed. Once the first absorber layer 18 has been deposited on the substrate 20, the deposited first absorber layer 18 and the substrate 20 can be removed from the deposition apparatus. The substrate 20 and the deposited first absorber layer 18 can then be introduced to a liquid coating apparatus, such as a slot die apparatus, to deposit the first SLML 12 on the deposited first absorber layer 18. Once the first SLML 12 has been deposited and cured, the first reflector layer 14 can then be deposited on the first SLML 12 by conventional deposition processes. Once the first reflector layer 14 has been deposited, a magnetic-containing layer 16 can be deposited on the first reflector layer 14. The above process can then be repeated in a reverse order. For example, a second reflector layer 14' can be deposited on the magnetic-containing layer 16 using conventional deposition processes. The substrate 20 and deposited layers can be removed from the deposition apparatus and introduced to a liquid coating apparatus. Using a liquid coating process the second SLML 12' can be deposited on the second reflector layer 14'. Once the second SLML 12' has been cured, the substrate 20 and all of the deposited layers can be transferred to a conventional deposition process apparatus to deposit a second absorber layer 18'. Alternatively or additionally, the magnetic-containing layer 16 can also be deposited using a liquid coating process. The liquid coating process includes, but is not limited to: slot-bead, slide bead, slot curtain, slide curtain, in single and multilayer coating, tensioned web slot, gravure, roll coating, and other liquid coating and printing processes that apply a liquid on to a substrate to form a liquid layer or film that is subsequently dried and/or cured to the final SLML layer.

The substrate 20 can then be released from the deposited layers to create the article 10, for example as shown in FIG. 1. In an aspect, the substrate 20 can be cooled to em brittle the associated release layer 22. In another aspect, the release layer 22 could be embrittled for example by heating and/or curing with photonic or e-beam energy, to increase the degree of cross-linking, which would enable stripping. The deposited layers can then be stripped mechanically, such as by sharp bending or brushing of the surface. The released and stripped layers can be sized into article 10, such as an optical device in the form of a flake, foil, or sheet, using known techniques.

In another aspect, the deposited layers can be transferred from the substrate 20 to another surface. The deposited layers can be punched or cut to produce large flakes with well-defined sizes and shapes.

As stated above, each of the first and second SLML 12, 12' can be deposited by a liquid coating process, such as a slot die process. However, it was previously believed that liquid coating processes, such as a slot die process, could not operate stably at optical thicknesses, such as from about 50 to about 700 nm. In particular, the very thin, wet films have commonly formed islands of thick areas where solids have been wicked away from the surrounding thin areas by capillary forces as solvents evaporate. This reticulated appearance was not compatible with optical coatings as the variable thickness can result in a wide range of optical path lengths, such as a wide range of colors resulting in a speckled/textured appearance, as well as reduced color uniformity of the optical coating and low chromaticity.

In an aspect of the present disclosure, the SLML 12, 12' can be formed using a liquid coating process, such as a slot die process. In an aspect, the liquid coating process includes, but is not limited to: slot-bead, slide bead, slot curtain, slide curtain, in single and multilayer coating, tensioned web slot, gravure, roll coating, and other liquid coating and printing processes that apply a liquid on to a substrate to form a liquid layer or film that is subsequently dried and/or cured to the final SLML layer. The liquid coating process can allow for the transfer of the composition of the SLML 12, 12' at a faster rate as compared to other deposition techniques, such as vapor deposition.

Additionally, the liquid coating process can allow for a wider variety of materials to be used in the SLML 12, 12' with a simple equipment set up. It is believed that the SLML 12, 12' formed using the disclosed liquid coating process can exhibit improved optical performance.

Figure 3:
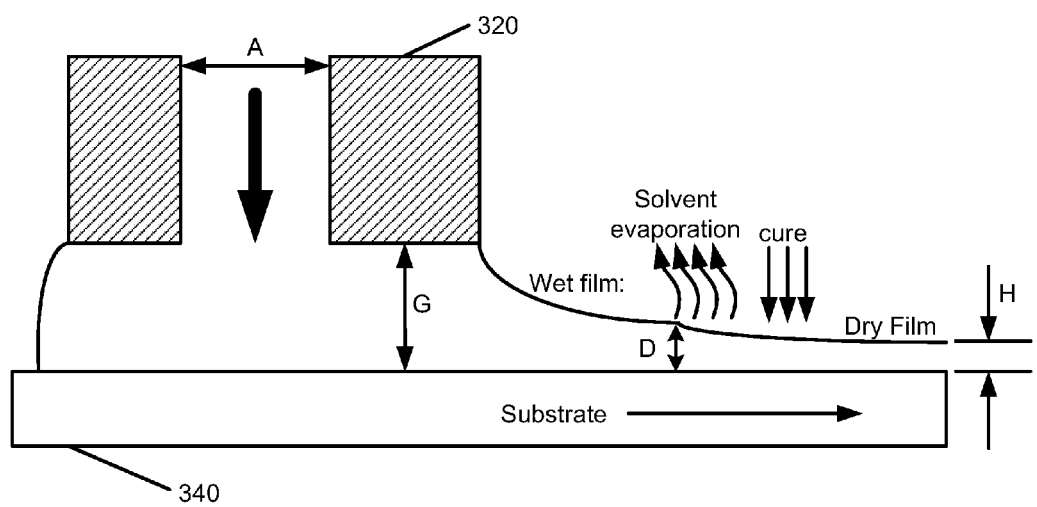
FIG. 3 is a cross-sectional view of a liquid coating process showing the stages of depositing a selective light modulator layer.

FIG. 3 illustrates the formation of the SLML (e.g., dielectric layers) 12, 12' using a liquid coating process. The composition of the SLML (a liquid coating composition) can be inserted into a slot die 320 and deposited on a substrate 340 resulting in a wet film. With reference to the process disclosed above, the substrate 340 can include the substrate 20, with or without a release layer 22, and a deposited first absorber layer 18 as shown in FIG. 2. In another aspect, the substrate 340 can include the substrate 20, a first absorber layer 18, a first SLML 12, a first reflector layer 14, a magnetic-containing layer 16, and a second reflector layer 14'. In an aspect, the substrate 340 can be any combination of substrate 20 and/or deposited layers. The distance from the bottom of the slot die 320 to the substrate 340 is the slot gap G. As can be seen in FIG. 3, the liquid coating composition can be deposited at a wet film thickness D that is greater than a dry film thickness H. After the wet film has been deposited on the substrate 340, any solvent present in the wet film can be evaporated. The liquid coating process continues with curing of the wet film to result in cured, self-leveled SLML 12, 12' having the correct optical thickness H (ranging from about 50 to about 700 nm). It is believed that the ability of the SLML 12, 12' to self-level results in a layer having a reduced optical thickness variation across the layer. Ultimately, an article 10 comprising the self-leveled SLML 12, 12' can exhibit increased optical precision. For ease of understanding, the terms "wet film" and "dry film" will be used to refer to the composition at various stages of the liquid coating process that results in the SLML 12, 12'.

The liquid coating process can comprise adjusting at least one of a coating speed and a slot gap G to achieve a wet film with a predetermined thickness D. The SLML 12, 12' can each be deposited having a wet film thickness D ranging from about 0.1 µm to about 500 µm, for example from about 0.1 µm to about 5 µm. The SLML 12, 12' formed with a wet film thickness D in the disclosed range can result in a stable SLML, i.e., without breaks or defects such as ribbing or streaks. In an aspect, the wet film can have a thickness of about 10 µm for a stable wet film using a slot die bead mode with a coating speed up to about 100 m/min. In another aspect, the wet film can have a thickness of about 6-7 µm for a stable wet film using a slot die curtain mode with a coating speed up to about 1200 m/min.

The liquid coating process can include a ratio of slot gap G to wet film thickness D of about 1 to about 100 at speeds from about 0.1 to about 1000 m/min. In an aspect, the ratio is about 9 at a coating speed of about 100 m/min. In an aspect, the ratio can be about 20 at a coating speed of about 50 m/min. The liquid coating process can have a slot gap G ranging from about 0 to about 1000 µm. A smaller slot gap can allow for a reduced wet film thickness. In slot-bead mode higher coating speeds can be achieved with a wet film thickness greater than 10 µm.

The liquid coating process can have a coating speed ranging from about 0.1 to about 1000 m/min, for example from about 25 m/min to about 950 m/min, for example from about 100 m/min to about 900 m/min, and as a further example from about 200 m/min to about 850 m/min. In an aspect, the coating speed is greater than about 150 m/min, and in a further example is greater than about 500 m/min.

In an aspect, the coating speed for a bead mode liquid coating process can range from about 0.1 m/min to about 600 m/min, and for example from about 50 to about 150 m/min. In another aspect, the coating speed for a curtain mode liquid coating process can range from about 200 m/min to about 1500 m/min, and for example from about 300 m/min to about 1200 m/min.

As shown in FIG. 3, the solvent can be evaporated from the wet film, such as before the wet film is cured. In an aspect, about 100%, for example about 99.9%, and as a further example about 99.8% of the solvent can be evaporated from the composition of the SLML 12, 12', prior to curing of the SLML 12, 12'. In a further aspect, trace amounts of solvent can be present in a cured/dry SLML 12, 12'. In an aspect, a wet film having a greater original weight percent of solvent can result in a dry film having a reduced film thickness H. In particular, a wet film having a high weight percent of solvent and being deposited at a high wet film thickness D can result in a SLML 12, 12' having a low dry film thickness H. It is important to note, that after evaporation of the solvent, the wet film remains a liquid thereby avoiding problems such as skinning, and island formation during the subsequent curing steps in the liquid coating process.

The dynamic viscosity of the wet film can range from about 0.5 to about 50 cP, for example from about 1 to about 45 cP, and as a further example from about 2 to about 40 cP. The viscosity measurement temperature is 25° C., the rheology was measured with an Anton Paar MCR 101 rheometer equipped with a solvent trap using a cone/plate 40 mm diameter with 0.3° angle at a gap setting of 0.025 mm.

In an aspect, the composition of the SLML 12, 12' and the solvent can be selected so that the wet film exhibits Newtonian behavior for precision coating of the SLMLs using the liquid coating process. The wet film can exhibit Newtonian behavior shear rates up to about 10,000 s$^{-1}$ and higher. In an aspect, the shear rate for the liquid coating process can be about 1000 s$^{-1}$ for a coating speed up to about 25 m/min, for example about 3900 s$^{-1}$ for a coating speed up to about 100 m/min, and as a further example about 7900 s$^{-1}$ for a coating speed up to about 200 m/min. It will be understood that a maximum shear rate can occur on a very thin wet film, such as about 1 μm thick. As the wet film thickness is increased, the shear rate can be expected to decrease, for example decrease 15% for a 10 μm wet film, and as a further example decrease 30% for a 20 μm wet film.

The evaporation of the solvent from the wet film can cause a change in viscosity behavior to pseudoplastic, which can be beneficial to achieve a precision SLML. The dynamic viscosity of the deposited first and second SLML 12, 12', after any solvent has been evaporated, can range from about 10 cP to about 3000 cP, for example from about 20 cP to about 2500 cP, and as a further example from about 30 cP to about 2000 cP. When evaporating the solvent, if present, from the wet film there can be an increase in viscosity to the pseudoplastic behavior. The pseudoplastic behavior can allow for self-leveling of the wet film.

In an aspect, the method can include evaporating the solvent present in the wet film using known techniques. The amount of time required to evaporate the solvent can be dependent upon the speed of the web/substrate and the dryer capacity. In an aspect, the temperature of the dryer (not shown) can be less than about 120° C., for example less than about 100° C., and as a further example less than about 80° C.

The wet film deposited using a liquid coating process can be cured using known techniques. In an aspect, the wet film can be cured using a curing agent utilizing at least one of an ultraviolet light, visible light, infrared, or electron beam. Curing can proceed in an inert or ambient atmosphere. In an aspect, the curing step utilizes an ultraviolet light source having a wavelength of about 395 nm. The ultraviolet light source can be applied to the wet film at a dose ranging from about 200 mJ/cm$^2$ to about 1000 mJ/cm$^2$ for example ranging from about 250 mJ/cm$^2$ to about 900 mJ/cm$^2$, and as a further example from about 300 mJ/cm$^2$ to about 850 mJ/cm$^2$.

The wet film can crosslink by known techniques. Non-limiting examples include photoinduced polymerization, such as free radical polymerization, spectrally sensitized photoinduced free radical polymerization, photoinduced cationic polymerization, spectrally sensitized photoinduced cationic polymerization, and photoinduced cycloaddition; electron beam induced polymerization, such as electron beam induced free radical polymerization, electron beam induced cationic polymerization, and electron beam induced cycloaddition; and thermally induced polymerization, such as thermally induced cationic polymerization.

A SLML 12, 12' formed using the liquid coating process can exhibit improved optical performance, i.e., be a precision SLML. In some examples, a precision SLML 12, 12' can be understood to mean a SLML having less than about 3% optical thickness variation, about 5% optical thickness variation, or about 7% optical thickness variation across the layer.

Conventional deposition processes for use in the method disclosed herein include, but are not limited to, physical vapor deposition (PVD), sputtering onto a mechanically vibrating bed of particles, decomposition by pyrolysis of metal-organo compounds, and a CVD fluidized bed.

In an example, the SLML includes an alicyclic epoxy resin host using a solvent dye as the SLMM, the reflector includes aluminum.

In an example, the SLML includes an alicyclic epoxy resin host using a Diketopyrrolopyrrole insoluble red dye as the SLMP, the reflector includes aluminum.

In an example, the SLML includes an acrylate oligomer resin host using white pigment (Titania) as the SLMP.

In an example, the SLML includes an acrylate oligomer resin host using black IR transparent pigment as the SLML, the reflector includes aluminum.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications may be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a coating and its many aspects, features and elements. Such a device can be dynamic in its use and operation, this disclosure is intended to encompass the equivalents, means, systems and methods of the use of the device and/or article of manufacture and its many aspects consistent with the description and spirit of the operations and functions disclosed herein. The claims of this application are likewise to be broadly construed.

The description of the inventions herein in their many embodiments is merely exemplary in nature and, thus, variations that do not depart from the gist of the invention are intended to be within the scope of the invention. Such variations are not to be regarded as a departure from the spirit and scope of the invention.

We claim:

1. An article comprising:
   a magnetic-containing layer having a first surface and a second surface opposite the first surface;
   a first reflector layer external to the first surface of the magnetic-containing layer;
   a second reflector layer external to the second surface of the magnetic-containing layer;
   a first selective light modulator layer external to the first reflector layer;
   a second selective light modulator layer external to the second reflector layer;
   a first absorber layer external to the first selective light modulator layer; and
   a second absorber layer external to the second selective light modulator layer;
   wherein at least one of the first and second selective light modulator layers comprises at least one of a curing agent, and at least one coating aid.

2. The article of claim 1, wherein the curing agent is at least one of solvents, radical generators (by energy or chemical), acid generators (by energy or chemical), condensation initiators, and acid/base catalysts.

3. The article of claim 1, wherein the at least one coating aid includes leveling agents, wetting agents, defoamers, adhesion promoters, antioxidants, UV stabilizers, curing inhibition mitigating agents, antifouling agents, corrosion inhibitors, photosensitizers, secondary crosslinkers, and infrared absorbers for enhanced infrared drying.

4. The article of claim 1, wherein the magnetic-containing layer comprises a polymer containing iron oxide particles.

5. The article of claim 1, wherein the first and second selective light modulator layers each independently include a solvent.

6. The article of claim 1, wherein the first and second selective light modulator layers each independently have less than about 3% variation in thickness across the layer.

7. The article of claim 1, wherein the first and second selective light modulator layers each independently have less than about 1% variation in thickness across the layer.

8. The article of claim 1, wherein the first and second selective light modulator layers each independently have a thickness of from about 1 nm to about 10000 nm.

9. A color shifting colorant comprising:
the article of claim 1; and a liquid medium.

10. An article comprising:
a magnetic containing layer having a first surface and a second surface opposite the first surface;
a first reflector layer external to the first surface of the magnetic-containing layer;
a second reflector layer external to the second surface of the magnetic-containing layer;
a first selective light modulator layer external to the first reflector layer;
a second selective light modulator layer external to the second reflector layer;
a first absorber layer external to the first selective light modulator layer; and
a second absorber layer external to the second selective light modulator layer;
wherein at least one of the first and second selective light modulator layers comprises at least one of a curing agent, and at least one oxygen inhibition mitigation composition.

11. A color shifting colorant comprising:
the article of claim 10; and a liquid medium.

12. The article of claim 10, wherein the curing agent utilizes at least one of ultraviolet light, visible light, infrared, or electron beam energy.

13. The article of claim 10, wherein the oxygen inhibition mitigation composition includes at least one of an acrylate monomer and at least one acrylate oligomer.

14. A method for forming an article comprising:
depositing on a substrate a first absorber layer;
depositing on the first absorber layer a first selective light modulator layer;
depositing on the first selective light modulator layer a first reflector layer;
depositing on the first reflector layer a magnetic-containing layer;
depositing on the magnetic-containing layer a second reflector layer;
depositing on the second reflector layer a second selective light modulator layer; and
depositing on the second selective light modulator layer a second absorber layer;
wherein at least one of the first and second selective light modulator layers comprises at least one of a curing agent, and at least one coating aid.

15. The method of claim 14, wherein the first and second selective light modulator layers each independently have a wet film thickness ranging from about 0.1 µm to about 500 µm.

16. The method of claim 15, wherein the wet film thickness ranges from about 0.1 µm to about 5 µm and results in a stable first and second selective light modulator layer.

17. The method of claim 14, wherein the magnetic-containing layer is deposited using a liquid coating process.

18. The method of claim 14, wherein the first and second selective light modulator layer each independently comprise a solvent and the liquid coating process further comprises evaporating the solvent from the deposited first and second selective light modulator layer and curing.

19. The method of claim 14, wherein the liquid coating process includes a ratio of slot gap to wet film thickness of about 9 at a coating speed of about 100 m/min.

20. The method of claim 14, wherein the liquid coating process includes a ratio of slot gap to wet film thickness of about 20 at a coating speed of about 50 m/min.

* * * * *